(12) United States Patent
Barr et al.

(10) Patent No.: US 6,711,814 B2
(45) Date of Patent: Mar. 30, 2004

(54) METHOD OF MAKING PRINTED CIRCUIT BOARD HAVING INDUCTIVE VIAS

(75) Inventors: Alexander W. Barr, Louisville, KY (US); Samuel C. Ramey, Naperville, IL (US); Larry Edward Moser, Marysville, IN (US)

(73) Assignee: Robinson Nugent, Inc., New Albany, IN (US)

( * ) Notice: Subject to any disclaimer, the term of this patent is extended or adjusted under 35 U.S.C. 154(b) by 59 days.

(21) Appl. No.: 09/883,876

(22) Filed: Jun. 18, 2001

(65) Prior Publication Data

US 2002/0022110 A1 Feb. 21, 2002

Related U.S. Application Data

(60) Provisional application No. 60/212,424, filed on Jun. 19, 2000, and provisional application No. 60/218,112, filed on Jul. 13, 2000.

(51) Int. Cl.⁷ .................................................. H01K 3/10
(52) U.S. Cl. .............................. 29/852; 29/847; 29/853; 174/262; 174/266; 361/767
(58) Field of Search .......................... 29/847, 850–853; 174/266, 262; 361/760, 767, 792, 795

(56) References Cited

U.S. PATENT DOCUMENTS

| | | | | |
|---|---|---|---|---|
| 2,502,291 | A | 3/1950 | Taylor ........................ | 29/830 |
| 3,148,356 | A | 9/1964 | Hedden, Jr. ................. | 365/55 |
| 3,268,652 | A | 8/1966 | Burns, et al. ............... | 174/262 |
| 3,348,990 | A | 10/1967 | Zimmerman, et al. ...... | 156/293 |
| 3,357,099 | A | 12/1967 | Nagy, et al. ................. | 29/852 |
| 3,400,210 | A | 9/1968 | Reimer ........................ | 174/266 |
| 3,509,270 | A | 4/1970 | Dube, et al. ................. | 174/266 |
| 3,739,469 | A | * 6/1973 | Dougherty, Jr. ............. | 29/852 |
| 4,784,707 | A | * 11/1988 | Wefers et al. ............... | 174/88 B |
| 4,838,800 | A | 6/1989 | Lynch .......................... | 439/79 |
| 5,133,669 | A | * 7/1992 | Barnhouse et al. .......... | 29/874 |
| 5,414,223 | A | * 5/1995 | Suski et al. ................. | 361/753 |
| 5,425,816 | A | 6/1995 | Cavicchi, et al. ............ | 438/98 |
| 5,619,018 | A | 4/1997 | Rossi ........................... | 174/261 |
| 5,656,798 | A | 8/1997 | Kubo, et al. ................. | 174/265 |
| 5,940,731 | A | 8/1999 | Wu .............................. | 438/640 |
| 6,091,310 | A | 7/2000 | Utsumi et al. ............... | 333/12 |
| 6,137,064 | A | * 10/2000 | Kiani et al. .................. | 174/266 |

FOREIGN PATENT DOCUMENTS

| | | |
|---|---|---|
| DE | 2323529 | 11/1974 |
| DE | 2809841 | 9/1978 |
| EP | 0467698 | 1/1992 |
| JP | 04064278 | 2/1992 |
| JP | 04273410 | 9/1992 |
| JP | 05152702 | 6/1993 |
| JP | 11251702 | 9/1999 |

\* cited by examiner

*Primary Examiner*—Peter Vo
*Assistant Examiner*—Donghai Nguyen
(74) *Attorney, Agent, or Firm*—Barnes & Thornburg

(57) ABSTRACT

A method for increasing the impedance of a via for providing a conductive path through a printed circuit board is disclosed. The method comprises the steps of forming a conductive pad on the printed circuit board, forming a non-threaded opening extending through the conductive pad and through the printed circuit board to form an annular conductive pad surrounding the non-threaded opening, forming a conductive metal barrel lining the inner wall of the non-threaded opening connected to the annular conductive pad, and cutting material from the metal barrel to leave at least one conductive strip extending axially along the inner wall of the opening without cutting material from the annular conductive pad so that the at least one conductive strip is connected to an undivided annular conductive pad.

9 Claims, 5 Drawing Sheets

METHOD OF MAKING PRINTED CIRCUIT BOARD HAVING INDUCTIVE VIAS

CROSS-REFERENCE TO RELATED APPLICATION

This application claims the benefit of U.S. Provisional Patent Application, Ser. No. 60/212,424, filed on Jun. 19, 2000, and U.S. Provisional Patent Application, Ser. No. 60/218,112, filed on Jul. 13, 2000.

BACKGROUND AND SUMMARY OF THE INVENTION

The present invention generally relates to printed circuit boards, and, more particularly, the present invention relates to printed circuit boards having plated vias or holes.

In general, any structure that allows a signal to propagate from one point to another is defined as a transmission line. As a signal propagates along a transmission line, both a voltage and current are present. The ratio of these two parameters is defined as the characteristic impedance of the line. The characteristic impedance is a property that is determined solely by the material and geometry of the transmission line. The characteristic impedance of the transmission line is proportional to the ratio of the inductance and capacitance of the line. In general impedance is dependent upon frequency, but for lines that are essentially lossless, such as connectors and high quality cables, it can be considered constant.

When a transmission line is used to connect two points, ideally the signal arriving at the receiver end will be the same as that which entered the line at the driver end. However, if the transmission line changes characteristic impedance at any point along the way, such as occurs when a connector is placed between two circuit boards, the behavior becomes more complicated. At the interface where such an impedance change occurs, partial reflections of the signal will be created. These reflected waves will travel back toward the source where they may be re-reflected a second time. At each interface where an impedance change occurs, a reflected signal will be created. The reflections caused by these impedance mismatches have the ability to alter the original signal transmission. They can be very problematic because they can cause logic circuits to switch inadvertently. Furthermore, as signal risetimes drop below 1 ns, connectors, chip sockets and even circuit board vias begin to create large enough reflections as to potentially cause significant signal transmission concerns. Consequently, as clock rates increase and signal risetimes become short, all portions of the interconnection path need to be well matched to the impedances of the circuit boards and components they interconnect in order to avoid creating signal integrity problems.

Vias are created in printed circuit boards by forming metallic pads on the top and bottom surfaces of the board and on inner signal layers, drilling through holes through the pads and plating a hollow barrel of metal between the pads. Vias allow connections to be made between the inner signal layers or planes and the outside surfaces of the board. Vias are also used to connect outside components (such as connectors, surface mount components or integrated circuit chips) with the internal signal layers in the board.

The impedance of a via can be determined from its inductance and capacitance. The capacitance is created by the stray electric field present between the via and the various power or ground layers in the circuit board. The inductance of the via is related to the magnetic field surrounding the portion of the via carrying the signal current. Typically the inductance of the via is quite small relative to its capacitance. As such, most vias exhibit a very low impedance and are a poor match to typical circuit board trace impedances of 50–75 Ohms.

The impedance mismatches associated with vias are particularly difficult to address. Whereas the geometry of connectors and chip sockets can, with care, be designed to match the impedance of the components they will connect, few avenues are available to match the impedance of vias to the elements they interconnect. Reducing the via's capacitance or increasing the via's inductance will raise the via's impedance and create an improved match. This improvement will improve the capability to carry higher data rates from the circuit board through the via to the outside world. One may reduce the capacitance of the vias by reducing the length of the vias—for example, by counterboring the backside of the boards. Counterboring does not allow routing of signals to layers near the bottom of the printed circuit board. This limitation greatly reduces signal routing possibilities.

Other similar techniques for reducing the capacitance of the vias include reducing the diameter of the vias or increasing the clearance between the vias and the internal circuit board layers. In each case the idea is to reduce the electrostatic coupling between the via barrel and the conductor planes in the printed circuit board. Both of these techniques have drawbacks as well. Smaller diameter vias are more difficult to plate, particularly in thick printed circuit boards. Increasing the clearance between the vias and the internal circuit board layers can render large portions of the layers useless in regions where multiple vias are placed close together such as where a connector mounts to the board.

According to one aspect of the present invention, a method for improving the impedance match of a via having a conductive plating lining the inner wall thereof (also referred to herein as a "metal barrel or cylinder") includes a step of increasing the inductance of the via and, thus, its impedance as well. According to another aspect of the present invention, the step of increasing the inductance of the via includes a step of inserting a small inductive coil in the via. According to still another aspect of the present invention, the step of increasing the inductance of the via having a metal barrel includes a step of tapping a screw thread into the metal barrel to transform it into a short helical coil or strip. The inductance produced from this approach can be tightly controlled based on the pitch, width, and number of turns of the screw thread implemented in the via. The geometry of the helical coil can be tuned to obtain an inductance that allows the impedance of the via to be matched to the impedance of the circuit board.

According to a further aspect of the present invention, a method of increasing the inductance of the via without altering its geometry includes a step of plating the via with a paramagnetic or ferromagnetic material (such as nickel) to form a conductive barrel, instead of plating the via with the usual tin-lead over copper compound.

According to still another aspect of the present invention, a method for improving the impedance match of a via includes a step of reducing the capacitance of the via and, thereby increasing its impedance. According to yet another aspect of the present invention, the step of reducing the capacitance of the via having a metal barrel includes a step of cutting material from the metal barrel to leave at least one conductive strip or band extending axially along the wall of the via. According to still another aspect of the present invention, the step of reducing the capacitance of the via having a metal barrel includes a step of cutting material from the metal barrel to leave a plurality of conductive strips or bands extending axially along the wall of the via with axially extending, non-conductive spaces between the conductive strips.

Additional features of the present invention will become apparent to those skilled in the art upon a consideration of the following detailed description of the preferred embodiments exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Referring to the FIGS. 1–6, a PCB 10 includes a conductive trace 20 coupled to a conductive pad 22 on the top side 12 of the PCB 10, and a conductive trace 30 coupled to a conductive pad 32 on the bottom side 14 of the PCB 10. The top and bottom conductive pads 22, 32 are vertically aligned. The conductive traces 20, 30 are coupled to respective circuits (not shown) on the top and bottom sides 12, 14 of the PCB. The PCB 10 may be either a dual layer PCB as shown in FIGS. 1–6, or a multilayer PCB. The multilayer PCB comprises a number of PCBs that are stacked on top of each other and joined together.

Figures 1, 2, 3, 4:
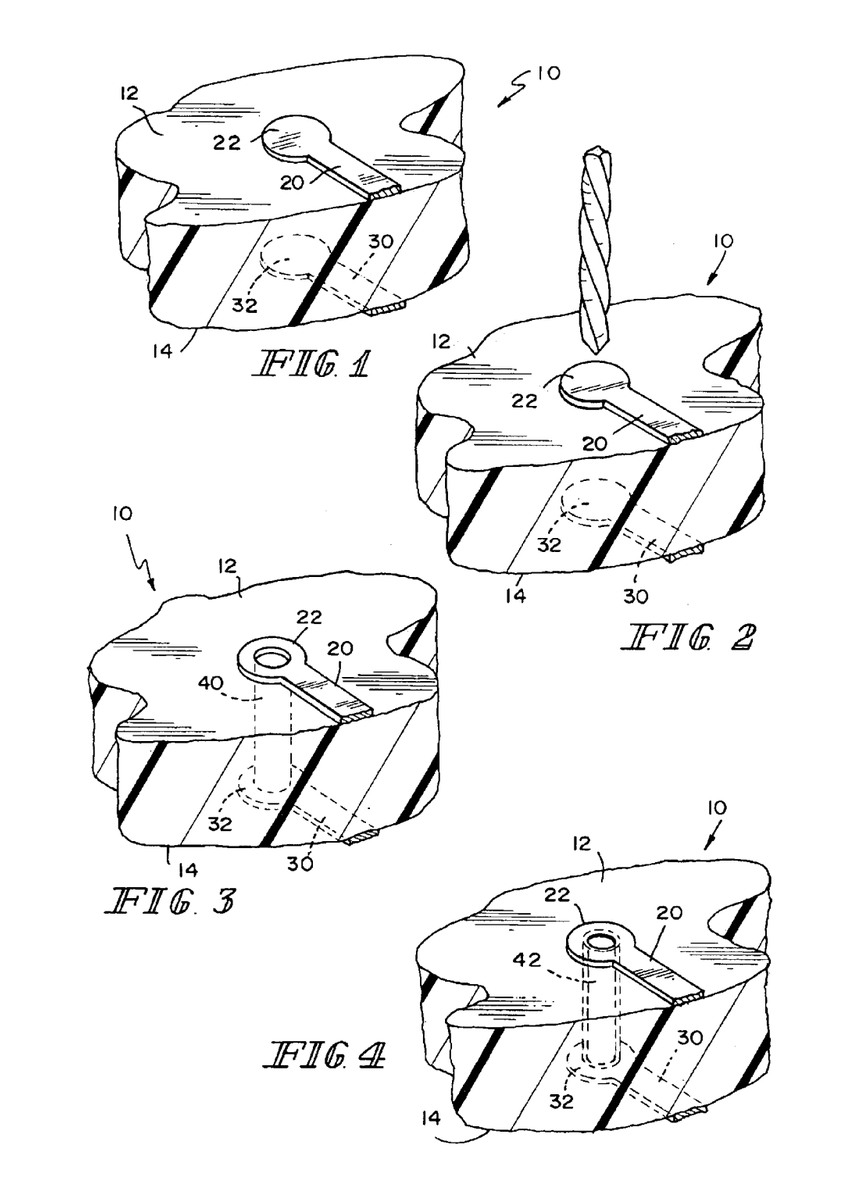
FIG. 1 is a perspective view of a dual layer printed circuit board ("PCB") showing a conductive trace coupled to a conductive pad on the top side of the PCB and a similar trace coupled to a conductive pad on the bottom side of the PCB shown in phantom.
FIG. 2 is a perspective view similar to FIG. 1 showing the PCB before a hole is drilled therethrough to form a conductive via connecting the top and bottom conductive pads.
FIG. 3 is a perspective view similar to FIG. 2 showing the through hole before it is plated.
FIG. 4 is a perspective view similar to FIG. 3 showing the through hole after it is plated; and showing a conductive metal cylinder or barrel (in phantom) lining the internal wall of the through hole to provide a conductive path between the opposed ends of the barrel and connecting the conductive pads.

A through via or hole 40 is drilled through the top conductive pad 22, through the PCB 10 and through the bottom conductive pad 32 as shown in FIG. 3. The via 40 is then plated using any suitable conventional technique to provide a metal lining or barrel 42 inside the via 40 as shown in FIG. 4. The metal barrel 42 is essentially a hollow metal cylinder lining the internal walls of the hole 40 with an annular conductive pad 22, 32 about each end of the cylinder. The metal barrel 42 provides a signal path between the conductive pads 22, 32 to route signal from the top side 12 of the PCB 10 to the bottom side 14 of the PCB 10.

Figure 5:
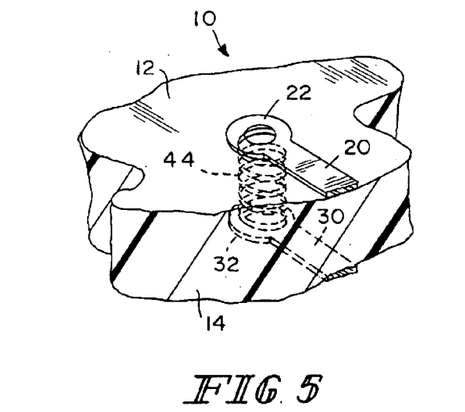
FIG. 5 is a perspective view similar to FIG. 4 showing the plated through hole after tapping a screw thread to transform it into a short helical coil or strip (in phantom) connecting the top and bottom conductive pads.
Figure 6:
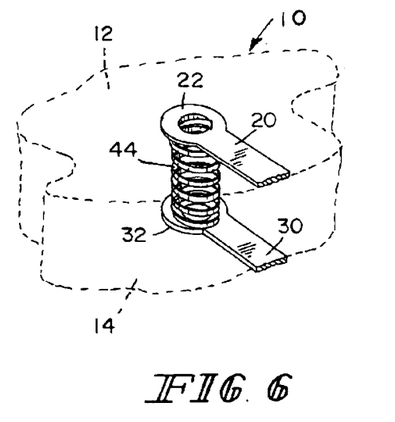
FIG. 6 is a perspective view similar to FIG. 5 showing the PCB in phantom, and showing the short helical coil connecting the top and bottom conductive pads in solid lines.

As previously indicated, vias exhibit stray capacitance in the electrical path because of the plated barrel's proximity to other conducting layers in the PCB, such as inner ground or power layers. The problem is particularly acute when vias are used for transmitting higher frequency signals between the layers. In accordance with one aspect of this invention, the length of the conductive path through the via 40 is increased by tapping a screw thread into the barrel 42 to transform it into a short helical coil 44 extending axially between the opposed ends of the barrel 42. This approach also serves to reduce the cross-sectional area of the current path through the via 40. The inductance produced from this approach can be tightly controlled based on the pitch, width, and number of turns of the screw thread implemented in the via 40. Thus, this approach allows the impedance of the via 40 to be closely matched to the impedance of the PCB 10.

Figures 7, 8, 9:
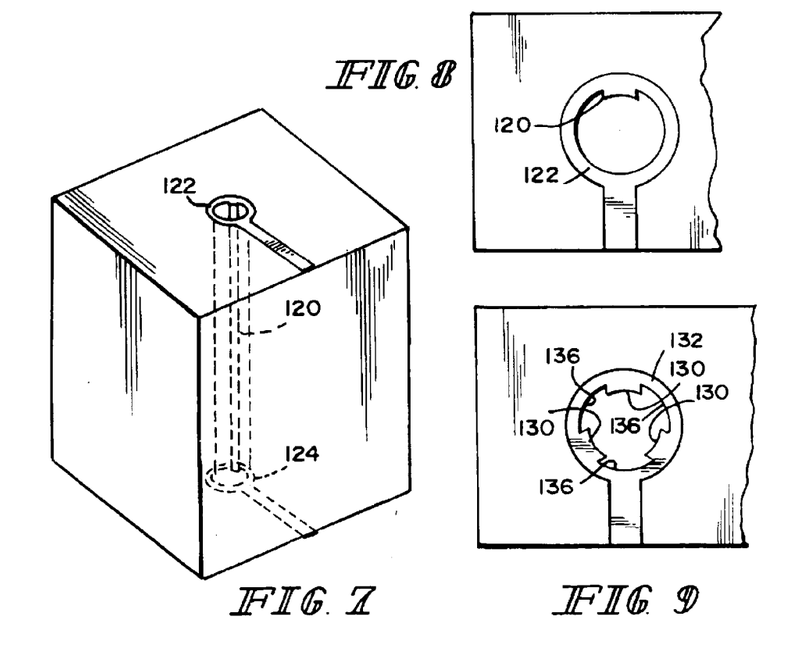
FIG. 7 is a perspective view of a PCB similar to FIG. 1 showing a conductive strip extending axially between the top and bottom conductive pads, and formed by broaching a plated through hole.
FIG. 8 is a top view of the FIG. 7 PCB showing the conductive strip extending axially between the top and bottom conductive pads.
FIG. 9 is a top view similar to FIG. 8, but showing three radially spaced conductive strips extending axially between the top and bottom conductive pads, and separated by a plurality of non-conductive axially extending spaces.

Alternatively, as shown in FIGS. 7–9, one may reduce the stray capacitance exhibited by the metal barrel 42 by cutting (for example, broaching) the metal barrel 42 to remove vertical strips of metal from the barrel 42, leaving one or more conductive strips extending axially along the wall of the via 40 with nonconductive spaces between the conductive strips. As previously mentioned, reduction of the stray capacitance will increase the impedance and reduce the impedance mismatch between the via 40 and the PCB 10, and thus improve the signal transmission quality through the via 40. This improvement will improve the capability to carry higher data rates from the PCB 10 through the via 40 to the outside world. FIGS. 7 and 8 show one conductive strip 120 extending axially between top and bottom conductive pads 122, 124. Alternately, a broach may have a triangular cross section (for example, a three cornered file) such that it cuts away three separate radially spaced, axially extending non-conductive spaces 136 leaving three equis-paced conductive strips 130 extending axially between top and bottom conductive pads 132, 134. It will be appreciated that several broach cross sections may be designed to remove different amounts or configurations of the barrel 42. This approach also reduces the cross sectional area of the current path through the via 40 to increase the inductance of the via 40 and, thus, its impedance as well.

Figure 10:
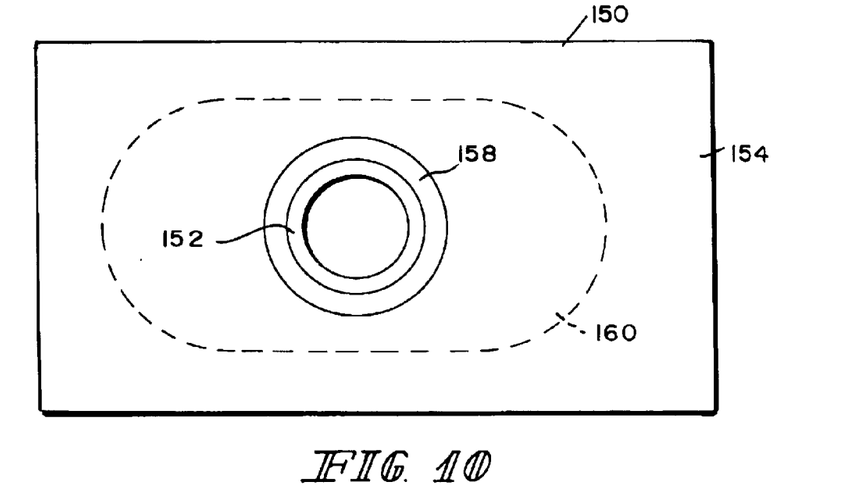
FIG. 10 is a plan view of a multi-layer PCB comprising a plurality of signal and ground planes, and having a via comprising a conductive metal barrel lining a through opening therein.
Figure 11:
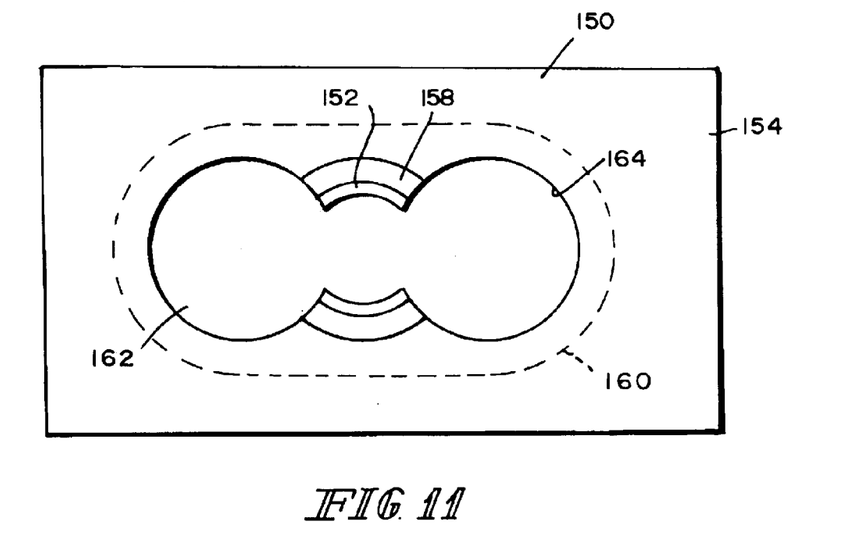
FIG. 11 is a plan view of the PCB of FIG. 10 after two holes are drilled on the opposite sides of the via such that each hole removes approximately one quarter of the annulus comprising the via.
Figure 12:
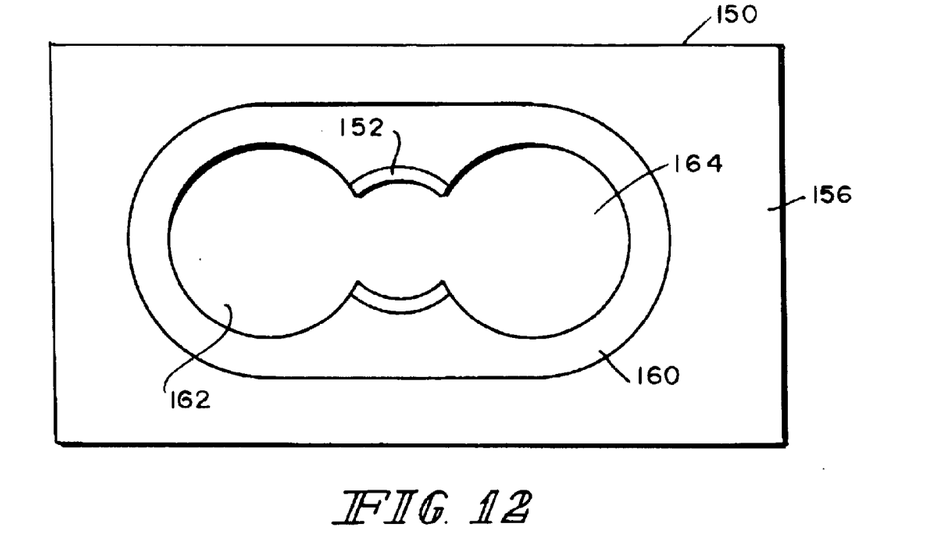
FIG. 12 is a sectional view of the PCB of FIGS. 10 and 11 through a ground plane, and showing a keep-out area surrounding the via and the two holes on the opposite sides thereof.
Figure 13:
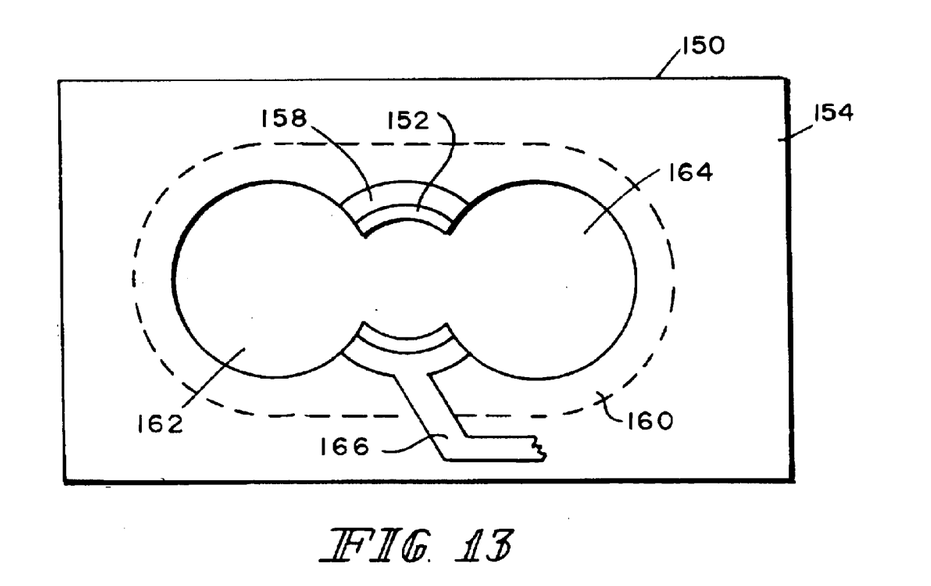
FIG. 13 is a sectional view of the PCB of FIGS. 10 and 11 through an inner signal layer, and showing a signal trace connected to a conductive pad thereon.
Figure 14:
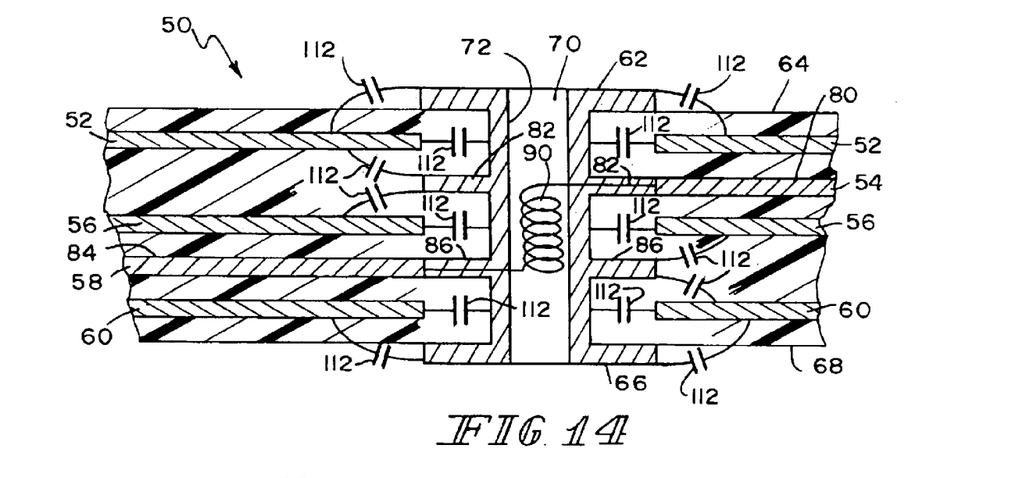
FIG. 14 is a sectional view of a multi-layer PCB having a plurality of signal planes alternating with ground planes to form a ground, signal, ground, signal and ground configuration, and showing a pair of oppositely disposed conductive pads on top and bottom sides of the PCB, a conductive cylinder or barrel extending between the conductive pads and a coil connecting the two signal layers and schematically representing the inductance of the conductive via.

FIGS. 10–13 illustrate another method for broaching material from the metal barrel of a via 152 to reduce the stray capacitance between the via 152 and the ground planes 156 in a multi-layer PCB 150. FIG. 10 shows a plan view of the PCB 150 having a via 152. The via 152 is in the form of a conductive metal barrel lining a through opening in the PCB 150 as is typical practice. The PCB 150 may comprise alternating signal and ground layers or planes 154, 156 arranged in a stack-up configuration, for example, as shown in FIG. 14. The top, bottom and intermediate signal layers of the PCB 150 include conductive pads 158 that are connected to the via 152. A generally oval-shaped keep-out area 160 is provided in the ground planes 156 through which the via 152 passes. The keep-out area 160 is shown by broken lines in FIGS. 10, 11 and 13, and in solid lines in FIG. 12. The keep-out area 160 is sized and shaped such that two additional through holes 162, 164 can be drilled in the PCB 150 adjacent to the via 152 on opposite sides thereof without piercing through the ground planes 156 as shown in FIGS. 11–13. The center lines of the two holes 162, 164 lie on the same line as the center line of the via 152. The holes 162, 164 are about the same size as the conductive pads 158, and are spaced such that each hole 162, 164 removes approximately one quarter of the ring comprising the via 152 on opposite sides thereof. FIG. 11 is a plan view of the PCB 150 after the two holes 162, 164 are drilled. FIG. 12 is a sectional view of the PCB 150 through a ground plane 156, and showing a keep-out area 160 in solid lines. Typically, a ground plane 156 will not have a conductive pad 158. FIG. 13 is a sectional view of the PCB 150 through an inner signal layer 154, and showing a signal trace 166 connected to a conductive pad 158 on the inner signal layer 154. Alternatively, one may drill three holes around the via 152 such as to leave only one axially extending conductive strip in the via 152, instead of two axially extending conductive strips on opposite sides of the via. 152.

The two holes 162, 164 may be drilled after plating the through hole in the PCB 150 to form the via 152. Alternatively, the plating of the via 152 may be done after the two holes 162, 164 are drilled on the opposite sides of the through hole in the PCB 150. If plating is done after drilling the two holes 162, 164 on the opposite sides of the via 152, the via 152 must be first cleaned to remove debris from the PCB 150 prior to plating, and care must be taken to avoid depositing metal on the two side holes 162, 164.

Another aspect of the present invention is to plate less than a full barrel lining the wall of a hole or via. For example, a mask may be provided to block plating from portions of the wall of the hole. One approach may be to use a masking wax or coating covering the walls of the holes. This coating could then be selectively removed before plating such that only removed portions of the wall would be plated. For example, a tap may be used to remove a helical trace in the wall of the coating so that a conductive helix is plated between the opposed ends of the hole. Alternatively, a broach may be used to remove radially spaced, axially extending strips of the coating so as to form axially extending conductive strips between the opposed ends of the hole. Still another approach for increasing the inductance of the via 40 without altering its geometry requires the use of a different plating material instead of the usual tin-lead over copper material commonly utilized in the industry. For example, plating the via with a paramagnetic or ferromagnetic material (such as nickel) to form a conductive barrel between the pads.

FIG. 14 shows yet another approach for increasing the inductance of a via 70. As shown therein, a multi-layer PCB 50 includes a ground layer 52 (GI), a signal layer 54 (S1), a ground layer 56 (G2), a signal layer 58 (S2) and a ground layer 60 (G3). The layers 52–60 are alternately ground and signal, and are arranged in a stack-up, sandwich configuration. The PCB 50 includes a conductive pad 62 on the top side 64 of the PCB 50, and a conductive pad 66 on the bottom side 68 of the PCB 50. The top and bottom conductive pads 62, 66 are vertically aligned. A through via or hole 70 is drilled through the top conductive pad 62, through the PCB 50 and through the bottom conductive pad 66. The via 70 is then plated using any suitable conventional technique to provide a metal lining or barrel 72 inside the via 70. The metal barrel 72 is essentially a hollow metal cylinder lining the internal walls of the via 70 with an annular conductive pad 62, 66 about each end of the cylinder. The metal barrel 72 provides an electrical path between the internal signal layers 54, 58 of the PCB 50, and between the conductive pads 62, 66 on the top and bottom sides 64, 68 of the PCB 50 to which external components may be connected. The signal layer 54 includes a conductive trace 80 coupled to a conductive pad 82. Likewise, the signal layer 58 includes a conductive trace 84 coupled to a conductive pad 86. The conductive traces 80, 84 are coupled to circuit elements (not shown) in the signal layers 54, 58 respectively. A coil 90 schematically represents the inductance encountered as the current travels from the signal layer 54 to the signal layer 58 of the PCB 50. Numeral 112 schematically represents the stray capacitance between the metal barrel 72 and the ground planes 52, 56 and 60.

As previously described, according to one aspect of the present invention, the step of increasing the inductance of the plated via includes a step of tapping a screw thread into the plated via to transform it into a short helical coil or strip. The inductance produced from this approach can be tightly controlled based on the pitch, width, and number of turns of the screw thread implemented in the via. The geometry of the helical coil can be tuned to obtain an inductance that allows the impedance of the via to be matched to the impedance of the circuit board.

According to yet another aspect of the present invention, the step of increasing the inductance or reducing the capacitance of the plated via includes a step of cutting material from the plated via (for example, by broaching) to leave at least one conductive strip or band extending axially along the wall of the via. According to still another aspect of the present invention, the step of increasing the inductance or reducing the capacitance of the plated via includes a step of cutting material from the plated via (for example, by broaching) to leave a plurality of conductive strips or bands extending axially along the wall of the via with axially extending nonconductive spaces between the conductive strips. According to a further aspect of the present invention, the step of increasing the inductance of the via includes a step of plating the via with a paramagnetic or ferromagnetic material (such as nickel) to form a conductive barrel between the pads, instead of plating the via with the usual tin-lead over copper compound.

Figure 15:
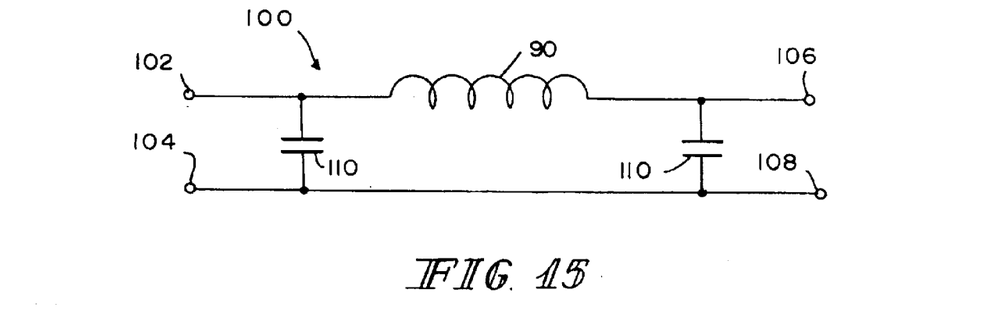
FIG. 15 is an equivalent electric circuit schematically representing the multi-layer PCB of FIG. 14.

FIG. 15 shows an equivalent circuit of the PCB 50 shown in FIG. 14. The electrical components of the PCB form a transmission line 100 between a first set of terminals 102, 104 and a second set of terminals 106, 108. The inductive coil 90 representing the inductance of the via 70 is coupled in series between the terminals 102, 106 of the transmission line 100. Equivalent capacitance 110 of the via 70 represents the summation of all stray capacitances 112 shown in FIG. 14. One half of the equivalent capacitance 110 is represented as coupled across the first set of terminals 102, 104 of the transmission line 100. The other half of the equivalent capacitance 110 is shown as coupled across the second set of terminals 106, 108 of the transmission line 100. The best impedance match occurs when the characteristic impedance of the transmission line 100 is equal to the square root of a fraction equal to the inductance of the coil 90 in the numerator and the capacitance of the equivalent capacitance 110 in the denominator. In other words, the best impedance match occurs when the inductance of the coil 90 is equal to the square of the characteristic impedance of the transmission line 100 multiplied by the capacitance of the equivalent capacitance 110.

Although the present invention has been described in detail with reference to certain preferred embodiments, variations and modifications exist within the scope and spirit of the present invention as described above.

What is claimed is:

1. A method for increasing the impedance of a via providing a conductive path through a printed circuit board, the method comprising the steps of:

forming a conductive pad on the opposite sides of the printed board, forming a non-threaded opening extending through the conductive pads and through the printed circuit board to form an annular conductive pad surrounding the non-threaded opening at each end thereof, forming a conductive metal barrel lining the inner wall of the non-threaded opening connected to the annular conductive pads, and cutting material from the metal barrel without dividing the annular conductive pads to leave at least one conductive strip extending axially along the inner wall of the opening connected to an undivided annular conductive at each end.

2. The method of claim 1, wherein the at least one axially extending conductive strip extends between the ends of the barrel.

3. The method of claim 1, wherein the step of cutting material from the metal barrel comprises using a broach to form the at least one axially extending conductive strip.

4. The method of claim 1, wherein the step of cutting material from the metal barrel comprises drilling at least one hole adjacent to the barrel to leave at least one axially extending conductive strip.

5. The method of claim 1, wherein the step of cutting material from the metal barrel comprises drilling two holes on the opposite sides of the barrel to leave two conductive strips extending axially along the wall of the opening on opposite sides thereof.

6. The method of claim 5, wherein the two conductive strips extending axially along the wall of the opening are separated by two axially extending air spaces.

7. The method of claim 5, further including a step of providing a conductive pad adjacent to one end of the barrel prior to the step of drilling two holes on the opposite sides of the metal barrel to leave two axially extending conductive strips.

8. The method of claim 1, wherein the step of cutting material from the metal barrel comprises drilling a plurality of holes around the barrel to leave a plurality of strips extending axially along the wall of the opening separated by a plurality of axially extending air spaces.

9. A method for increasing the impedance of a via providing a conductive path through a printed circuit board, the method comprising the steps of:

forming a conductive pad on the opposite sides of the printed-circuit board, forming a non-threaded opening extending through the conductive pads and through the printed circuit board, forming a conductive metal barrel lining the inner wall of the non-threaded opening connected to the conductive pads and cutting material from the metal barrel without dividing the conductive pads leave a plurality of conductive strips extending axially along the inner wall of the opening that each of an undivided conductive pad is coupled to each of the plurality of axially extending conductive strips.

* * * * *

UNITED STATES PATENT AND TRADEMARK OFFICE
CERTIFICATE OF CORRECTION

PATENT NO.    : 6,711,814 B2
DATED         : March 30, 2004
INVENTOR(S)   : Moser, Larry Edward It is certified that error appears in the above-identified patent and that said Letters Patent is hereby corrected as shown below:

<u>Column 6,</u>
Line 9, delete "(GI)" and insert -- (G1) -- therefor.

<u>Column 7,</u>
Line 30, after "printed" insert -- circuit --.
Line 42, after "conductive" insert -- pad --.

<u>Column 8,</u>
Line 32, delete "printed-circuit" insert -- printed circuit -- therefor.
Line 37, after "pads" insert -- , --.
Line 40, after "pads" insert -- to --.
Line 42, insert -- such -- before "that".

Signed and Sealed this

Twenty-fourth Day of August, 2004

JON W. DUDAS
*Director of the United States Patent and Trademark Office*